(12) United States Patent
Tsai et al.

(10) Patent No.: US 10,236,261 B2
(45) Date of Patent: Mar. 19, 2019

(54) ELECTRONIC PACKAGE AND METHOD FOR FABRICATING THE SAME

(71) Applicant: Siliconware Precision Industries Co., Ltd., Taichung (TW)

(72) Inventors: Fang-Lin Tsai, Taichung (TW); Yi-Feng Chang, Taichung (TW); Lung-Yuan Wang, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 1 day.

(21) Appl. No.: 15/492,394

(22) Filed: Apr. 20, 2017

(65) Prior Publication Data

US 2018/0211925 A1 Jul. 26, 2018

(30) Foreign Application Priority Data

Jan. 25, 2017 (TW) .............................. 106102894 A

(51) Int. Cl.
*H01L 23/552* (2006.01)
*H01L 21/48* (2006.01)
(Continued)

(52) U.S. Cl.
CPC ........ *H01L 23/552* (2013.01); *H01L 21/4817* (2013.01); *H01L 21/52* (2013.01); *H01L 21/563* (2013.01); *H01L 23/16* (2013.01); *H01L 23/3128* (2013.01); *H01L 21/561* (2013.01); *H01L 24/13* (2013.01); *H01L 24/16* (2013.01); *H01L 24/48* (2013.01); *H01L 24/73* (2013.01); *H01L 24/97* (2013.01); *H01L 25/0655* (2013.01); *H01L 25/50* (2013.01); *H01L 2224/131* (2013.01); *H01L 2224/16227* (2013.01); *H01L 2224/32225* (2013.01); *H01L 2224/48091* (2013.01);
(Continued)

(58) Field of Classification Search
None
See application file for complete search history.

(56) References Cited

U.S. PATENT DOCUMENTS 6,066,571 A * 5/2000 Usuda ............... H01L 21/02052
257/E21.228
2009/0256244 A1* 10/2009 Liao ...................... H01L 21/568
257/660

(Continued)

*Primary Examiner* — Duy T Nguyen
*Assistant Examiner* — Bo B Jang
(74) *Attorney, Agent, or Firm* — Mints Levin Cohn Ferris Glovsky and Popeo, P.C.; Peter F. Corless; Steven M. Jensen

(57) ABSTRACT

An electronic package is provided, which includes: a substrate; an electronic component and a shielding member disposed on the substrate; an encapsulant formed on the substrate and encapsulating the electronic component and the shielding member; and a metal layer formed on the encapsulant and electrically connected to the shielding member. A portion of a surface of the shielding member is exposed from a side surface of the encapsulant and in contact with the metal layer. As such, the width of the shielding member can be reduced so as to reduce the amount of solder paste used for bonding the shielding member to the substrate, thereby overcoming the conventional drawback of poor solder distribution. The present disclosure further provides a method for fabricating the electronic package.

7 Claims, 5 Drawing Sheets

(51) Int. Cl.
*H01L 21/56* (2006.01)
*H01L 21/52* (2006.01)
*H01L 23/31* (2006.01)
*H01L 23/16* (2006.01)
H01L 25/065 (2006.01)
H01L 25/00 (2006.01)
H01L 23/00 (2006.01)

(52) U.S. Cl.
CPC ............... *H01L 2224/48227* (2013.01); *H01L 2224/73265* (2013.01); *H01L 2224/97* (2013.01); *H01L 2924/15311* (2013.01); *H01L 2924/1815* (2013.01); *H01L 2924/19041* (2013.01); *H01L 2924/19042* (2013.01); *H01L 2924/19043* (2013.01); *H01L 2924/19105* (2013.01); *H01L 2924/3025* (2013.01)

(56) References Cited

U.S. PATENT DOCUMENTS

2013/0119549 A1* 5/2013 Cheng .................... B29C 39/10
257/772
2013/0285237 A1* 10/2013 Yu ...................... H01L 23/49811
257/738

\* cited by examiner

ELECTRONIC PACKAGE AND METHOD FOR FABRICATING THE SAME

CROSS-REFERENCE TO RELATED APPLICATION

This application claims under 35 U.S.C. § 119(a) the benefit of Taiwanese Patent Application No. 106102894 filed Jan. 25, 2017, the entire contents of which are incorporated herein by reference.

BACKGROUND

1. Technical Field

The present disclosure relates to packaging technologies, and, more particularly, to an electronic package having a shielding structure and a method for fabricating the electronic package.

2. Description of Related Art

Along with the progress of semiconductor technologies, various types of packages have been developed for semiconductor devices. To improve electrical performance, a lot of semiconductor products are provided with a shielding function so as to prevent occurrence of electromagnetic interference (EMI).

FIG. 1A is a schematic cross-sectional view of a conventional semiconductor package 1 having a shielding function. A plurality of semiconductor elements 11 are disposed on and electrically connected to a substrate 10, and a plurality of metal shielding members 12 are disposed on the substrate 10 between adjacent semiconductor elements 11 to prevent EMI from occurring between the semiconductor elements 11. Each of the metal shielding members 12 has a first end 12a and a second end 12b opposite to the first end 12a and attached to the substrate 10 through a solder paste 9, as shown in FIG. 1B.

However, in the conventional semiconductor package 1, since the first end 12a and the second end 12b of the metal shielding member 12 have the same width w, the attaching area between the second end 12b and the substrate 10 is much greater than that between a common element and the substrate 10, thus consuming a large amount of the solder paste 9. Consequently, during a subsequent high temperature process (for example, a reflow process), poor solder distribution may occur. For example, solder bridging may occur between the semiconductor elements 11 and hence result in a short circuit. As such, the product yield is reduced.

Therefore, there is a need to provide an electronic package and a method for fabricating the same so as to overcome the above-described drawbacks.

SUMMARY

In view of the above-described drawbacks, the present disclosure provides an electronic package, which comprises: a substrate; an electronic component disposed on the substrate; a shielding member disposed on the substrate; an encapsulant formed on the substrate and encapsulating the electronic component and the shielding member, wherein a portion of a surface of the shielding member is exposed from a side surface of the encapsulant; and a metal layer formed on the encapsulant and in contact with the portion of the surface of the shielding member exposed from the encapsulant.

The present disclosure further provides a method for fabricating an electronic package, which comprises: disposing an electronic component and a shielding member on a substrate; forming an encapsulant on the substrate to encapsulate the electronic component and the shielding member, wherein the encapsulant has a recessed portion, and a portion of a surface of the shielding member is exposed from a wall surface of the recessed portion; and forming a metal layer on the encapsulant, wherein the metal layer extends into the recessed portion and is in contact with the portion of the surface of the shielding member exposed from the recessed portion of the encapsulant.

In an embodiment, the recessed portion can have a varying width in a longitudinal section.

In an embodiment, after forming the metal layer, the method of the present disclosure further comprises performing a singulation process along the recessed portion.

In an embodiment, the shielding member can have a top portion and a wall portion bonded to the substrate and supporting the top portion, wherein a portion of a surface of the top portion is in contact with the metal layer, and the top portion is wider than the wall portion. Further, the wall portion can be encapsulated by the encapsulant. In an embodiment, the wall portion has a plurality of inner walls and a plurality of outer walls surrounding the inner walls, and the gap between the inner walls is less than the gap between the outer walls. In an embodiment, the electronic package further comprises another electronic component, and the inner walls are disposed between the electronic component and the another electronic component. In an embodiment, the encapsulant is formed between a portion of the top portion and the metal layer. In an embodiment, the shielding member can have a post portion supporting the top portion. In an embodiment, the wall portion and the post portion can be alternately arranged. In an embodiment, the wall portion can have a varying width in a longitudinal section.

In an embodiment, the side surface of the encapsulant or the wall surface of the recessed portion can be opposite to a tilting surface of the substrate.

In an embodiment, the metal layer can be further formed on the side surface of the encapsulant or the wall surface of the recessed portion.

Since the metal layer extends to the wall surface of the recessed portion, the present disclosure can reduce the width of the shielding member or the wall portion. Consequently, compared with the prior art, the present disclosure reduces the amount of a conductive material (or solder paste) used for bonding the shielding member to the substrate, thereby overcoming the conventional drawback of poor solder distribution.

DETAILED DESCRIPTION OF EMBODIMENTS

The following illustrative embodiments are provided to illustrate the disclosure of the present disclosure, these and other advantages and effects can be apparent to those in the art after reading this specification.

It should be noted that all the drawings are not intended to limit the present disclosure. Various modifications and variations can be made without departing from the spirit of the present disclosure. Further, terms such as "first", "second", "upper", "lower", "top", "side", "a" etc. are merely for illustrative purposes and should not be construed to limit the scope of the present disclosure.

FIGS. 2A to 2D are schematic cross-sectional views showing a method for fabricating an electronic package 2 according to the present disclosure.

Figure 2A:
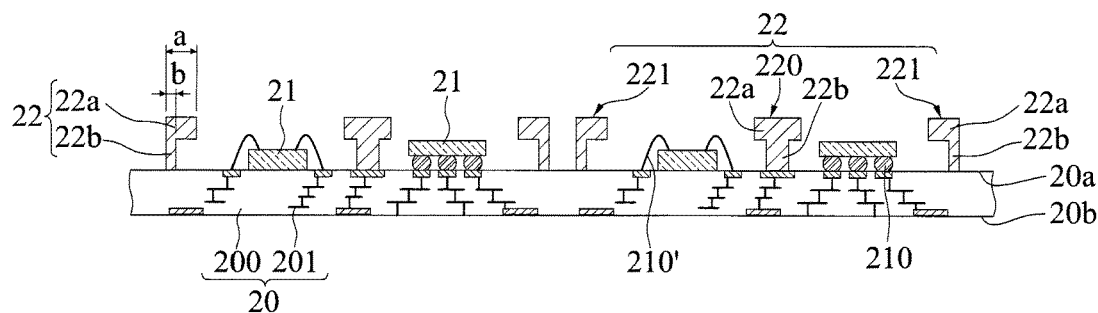
FIGS. 2A to 2D are schematic cross-sectional views showing a method for fabricating an electronic package according to the present disclosure.

Referring to FIG. 2A, a substrate 20 having a first side 20a (e.g., an upper side) and an opposite second side 20b (e.g., a lower side) is provided. A plurality of electronic components 21 and a plurality of shielding members 22 are disposed on the first side 20a of the substrate 20, separated from one another.

In an embodiment, the substrate 20 is a circuit structure having a core layer or a coreless circuit structure, which has a plurality of insulating layers 200 and a plurality of circuit layers 201 such as fan-out redistribution layers formed on the insulating layers 200. In an embodiment, the circuit layers 201 are made of copper, and the insulating layers 201 are made of a dielectric material, such as polybenzoxazole (PBO), polyimide or prepreg.

The electronic components 21 comprise a package, an active element such as a semiconductor chip, a passive element such as a resistor, a capacitor or an inductor, and/or a combination thereof. In an embodiment, the electronic component 21 is an RF chip (e.g., a Bluetooth chip or a WiFi chip). Also, the electronic component 21 can be an electronic component free from EMI. In an embodiment, the electronic component 21 is disposed on the substrate 20 in a flip-chip manner and electrically connected to the circuit layers 201 through a plurality of conductive bumps 210 made of a solder material, for example. Alternatively, the electronic component 21 is electrically connected to the circuit layers 201 through a plurality of bonding wires 210'.

Figure 3A:
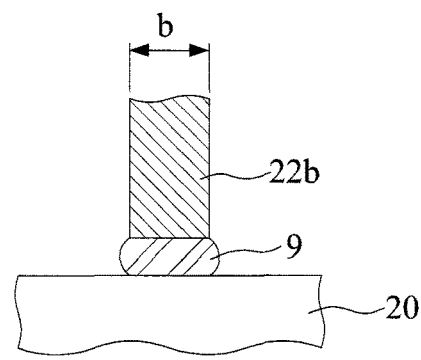
FIG. 3A is a partially enlarged view of FIG. 2A.

The shielding members 22 comprise a metal structure, which is vertically disposed on the substrate 20 through a conductive material such as a solder paste 9, as shown in FIG. 3A. The shielding members 22 are disposed around a periphery of the electronic components 21 and electrically connected to the circuit layers 201 to serve as an EMI shield, thereby preventing EMI from occurring between the electronic components 21. In an embodiment, each of the shielding members 22 has a top portion 22a and a wall portion 22b bonded to the substrate 20 and supporting the top portion 22a. The width a of the top portion 22a is greater than the width b of the wall portion 22b.

Figure 3B:
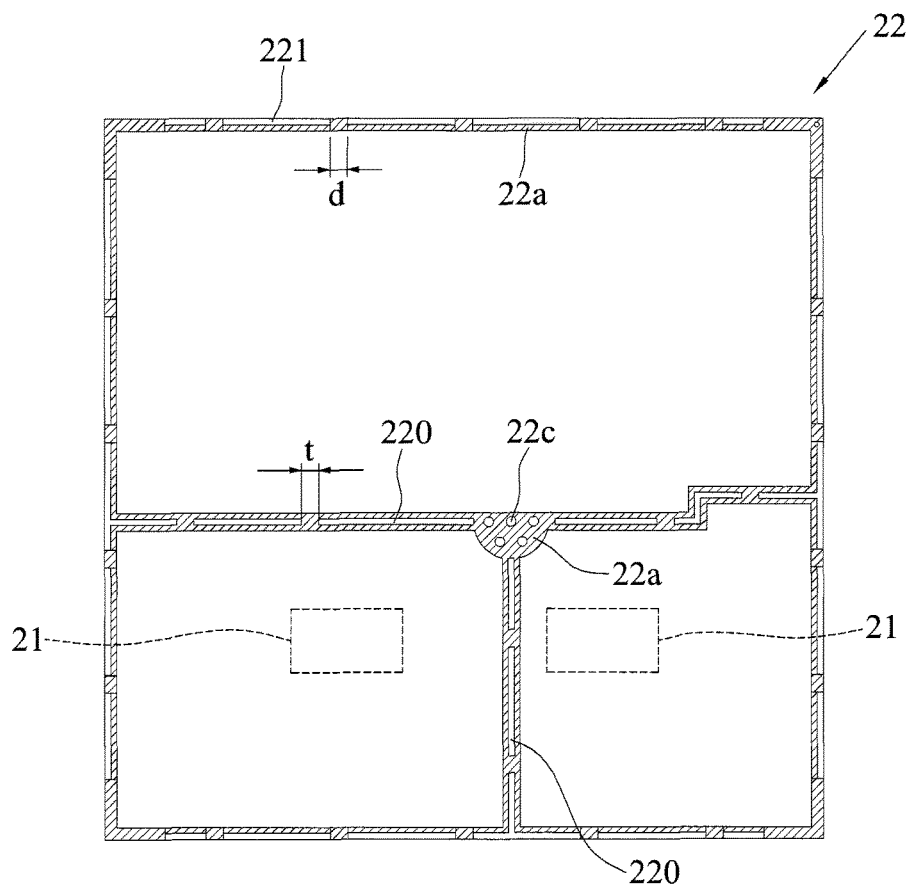
FIG. 3B is a schematic lower view of a shielding member according to an embodiment of the present disclosure.

FIG. 3B shows an embodiment of the shielding member 22. The top portion 22a of a grid shape is vertically disposed on the substrate 20. The wall portion 22b is disposed below the top portion 22a and has a plurality of inner walls 220 separated from one another and a plurality of outer walls 221 separated from one another. The outer walls 221 are positioned at an outer periphery of the grid-shaped top portion 22a and the inner walls 220 are positioned at the internal grid of the grid-shaped top portion 22a. The gap t between the inner walls 220 is less than the gap d between the outer walls 221. The inner walls 220 are disposed between two electronic components 21 (shown by dashed lines in FIG. 3B). Further, the shielding member 22 has a plurality of post portions 22c (e.g., circular or angular post portions) bonded to the substrate 20 and supporting the top portion 22a. The post portions 22c are adjacent to the inner walls 220 for strengthening the supporting effect when the top portion 22a has a large area. In an embodiment, the wall portion 22b such as the inner walls 220 and the post portions 22c are alternately arranged to achieve a preferred supporting effect.

Figure 4A:
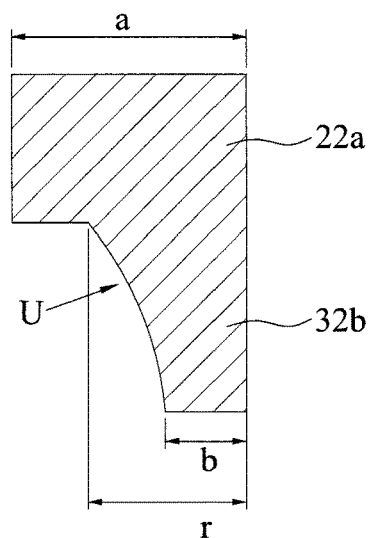
FIGS. 4A to 4D are schematic cross-sectional views showing various embodiments of the shielding member according to the present disclosure.
Figure 4B:
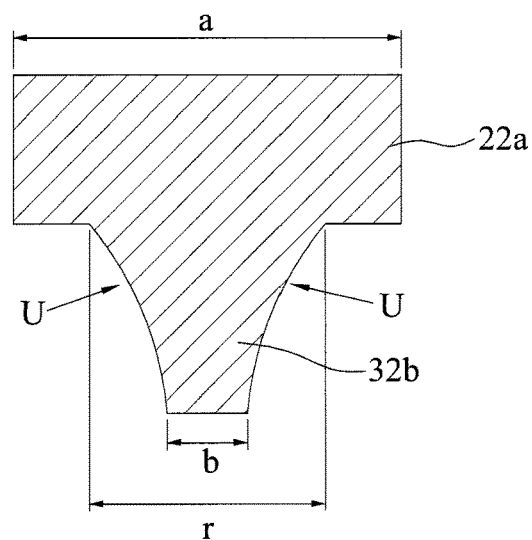
Figure 4C:
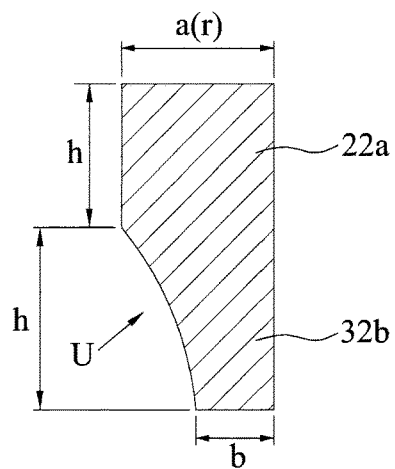
Figure 4D:
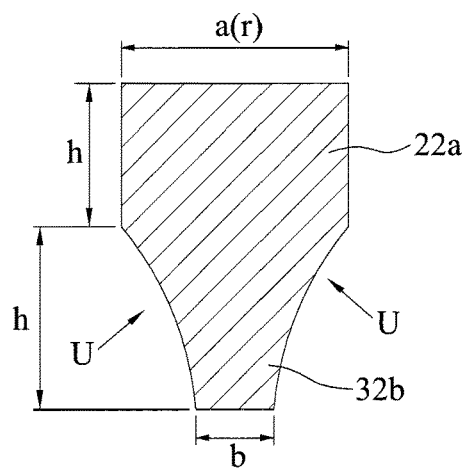

Further, to fabricate the shielding member 22, a grid-shaped frame having a uniform width is partially removed in the height direction by etching, thus obtaining the top portion 22a, the wall portion 22b and the post portions 22c that are integrally formed. Referring to FIG. 3B, a half of the frame is etched in the height direction. That is, the top portion 22a and the wall portion 22b (and the post portions 22c) have the same height h, as shown in FIGS. 4C and 4D.

Figure 2B:
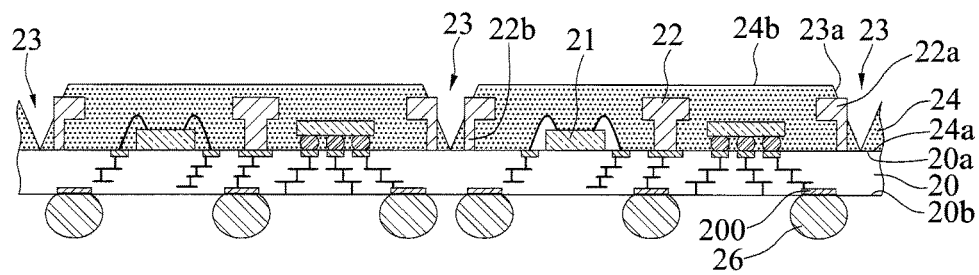

Referring to FIG. 2B, an encapsulant 24 is formed on the first side 20a of the substrate 20 to encapsulate the electronic components 21 and the shielding members 22. Then, a plurality of conductive elements 26 such as solder balls are disposed on the second side 20b of the substrate 20 and electrically connected to the circuit layers 201. As such, an electronic device, such as a package structure or a circuit board, can be further disposed on the conductive elements 26.

In an embodiment, the encapsulant 24 is made of an insulating material, such as polyimide, a dry film, an epoxy resin or a molding compound. The encapsulant 24 is formed on the first side 20a of the substrate 20 by lamination or molding. In an embodiment, the encapsulant 24 has a first surface 24a bonded to the first side 20a of the substrate 20 and a second surface 24b opposite to the first substrate 24a.

Further, the second surface 24b of the encapsulant 24 has a plurality of recessed portions 23. The top portions 22a of the shielding members 22 protrude from wall surfaces 23a of the recessed portions 23. The wall portions 22b of the shielding members 22 are encapsulated by the encapsulant 24. In an embodiment, each of the recessed portions 23 has a varying width in a longitudinal section. In an embodiment, the longitudinal section of the recessed portion 23 has a wide top and a narrow bottom, and is in an inverted triangular shape. As such, the wall surface 23a of the recessed portion 23 is opposite to a tilting surface of the first side 20a of the substrate 20.

Furthermore, to form the recessed portions 23, a portion of the encapsulant 24 is removed from the second surface 24b thereof by, for example, laser cutting, wedge cutting, grinding and so on. Alternatively, the encapsulant 24 having the recessed portions 23 is directly formed by molding.

Compared with the wall portion 22b, the post portions 22c facilitate flowing of the material of the encapsulant 24. Preferably, when the wall portion 22b and the post portions 22c are alternately arranged, the flowing of the material of the encapsulant 24 is increased.

Figure 2C:
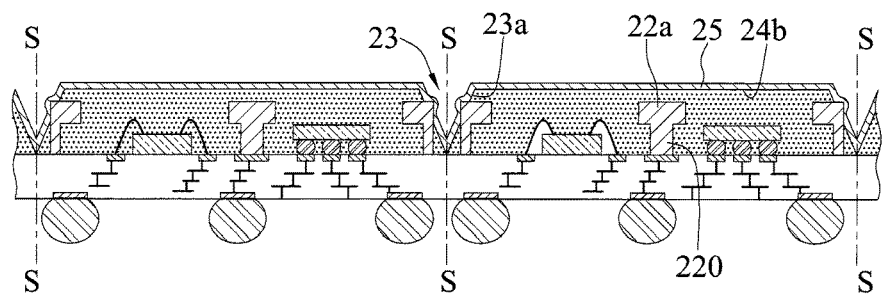

Referring to FIG. 2C, a metal layer 25 is formed on the second surface 24b of the encapsulant 24 and extends to the wall surfaces 23a of the recessed portions 23 without completely filling the recessed portions 23. As such, the metal layer 25 is in contact with the top portions 22a of the shielding members 22 so as to be electrically connected to the shielding members 22, thereby serving as an EMI partition.

In an embodiment, the metal layer 25 is made of Au, Ag, Cu, Ni, Fe, Al or stainless steel. The metal layer 25 can be formed by electroplating, coating, sputtering, chemical plating, electroless plating or evaporation. Alternatively, the metal layer 25 is a frame body directly disposed on the second surface 24b of the encapsulant 24.

Further, the encapsulant 24 is formed between a portion of the top portion 22a of the inner walls 220 and the metal layer 25.

Furthermore, the metal layer 25 may slightly protrude upward at a position corresponding to the top portion 22a. As such, the metal layer 25 may be leveled according to the practical need.

Figure 2D:
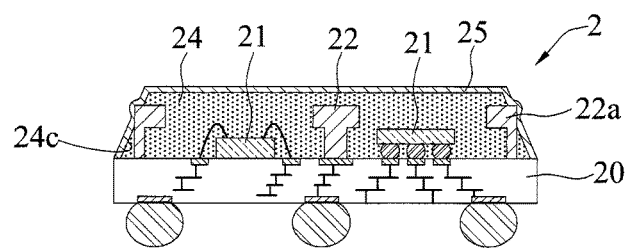

Referring to FIG. 2D, a singulation process is performed by using the recessed portions 23 as cutting paths (e.g., cutting paths S of FIG. 2C). As such, an electronic package 2 is obtained. The encapsulant 24 has a tilted side surface 24c.

Figure 1A:
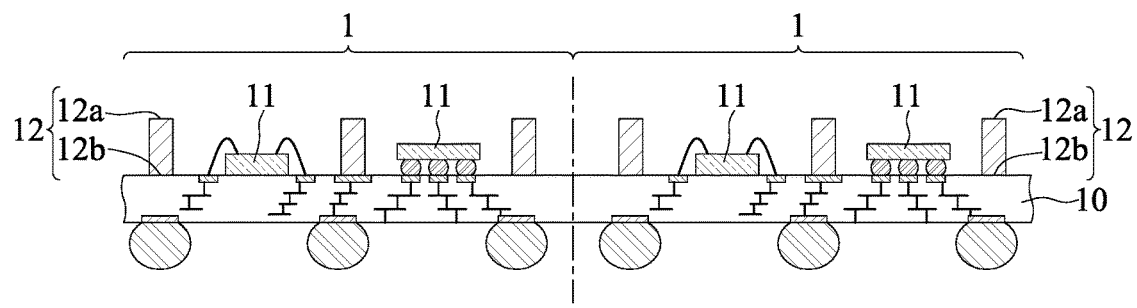
FIG. 1A is a schematic cross-sectional view of a conventional semiconductor package.
Figure 1B:
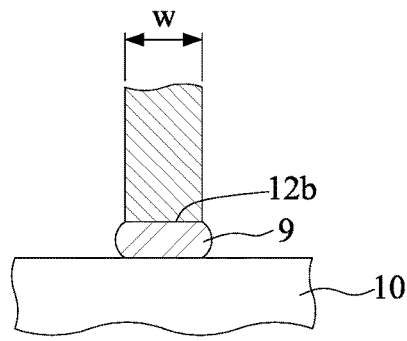
FIG. 1B is a partially enlarged view of FIG. 1A.

According to the present disclosure, the metal layer 25 extends to the wall surfaces 23a of the recessed portions 23 so as to reduce the width b of the wall portions 22b (the outer walls 221) of the shielding members 22 (less than the width w of the second end 12b of the conventional metal shielding member 12 of FIGS. 1A and 1B). Consequently, compared with the prior art, the present disclosure reduces the amount of the solder paste 9 used for bonding the shielding members 22 to the substrate 20, thereby overcoming the conventional drawback of poor solder distribution.

Further, the wall portion 22b of each of the shielding members 22 may have a varying width. Referring to FIGS. 4A and 4B, if the shielding member 22 is formed by etching, one or more side surfaces of the shielding member 22 may be a curved surface U. As such, the wall portion 32b has a varying width in the longitudinal section. In an embodiment, the width a of the top portion>the maximum width r of the wall portion>the minimum width b of the wall portion. Alternatively, referring to FIGS. 4C and 4D, the maximum width r of the wall portion 32b is equal to the width a of the top portion 22a. That is, the width a of the top portion=the maximum width r of the wall portion>the minimum width b of the wall portion.

Furthermore, during the operation of the electronic package 2, the shielding member 22 and the metal layer 25 not only protect the electronic components 21 against external EMI but also prevent EMI from occurring between the electronic components 21. Hence, the electronic package 2 can operate normally so as to achieve preferred electrical performance.

The present disclosure further provides an electronic package 2, which has: a substrate 20; a plurality of electronic components 21 disposed on and electrically connected to the substrate 20; a shielding member 22 bonded and electrically connected to the substrate 20 through a conductive material such as a solder paste 9 and disposed around a periphery of each of the electronic components 21; an encapsulant 24 formed on the substrate 20 to encapsulate the electronic components 21 and the shielding member 22, wherein a portion of a surface of the shielding member 22 is exposed from a side surface 24c of the encapsulant 24; and a metal layer 25 formed on a second surface 24b and the side surface 24c of the encapsulant 24 and in contact with and electrically connected to the shielding member 22.

In an embodiment, the shielding member 22 has a top portion 22a and a wall portion 22b, 32b bonded to the substrate 20 and supporting the top portion 22a. A portion of a surface of the top portion 22a is in contact with the metal layer 25. The width a of the top portion 22a is greater than the width b of the wall portion 22b, 32b. For example, the wall portion 22b, 32b is encapsulated by the encapsulant 24.

In an embodiment, the wall portion 22b, 32b has a plurality of inner walls 220 and a plurality of outer walls 221 surrounding the inner walls 220, and the gap t between the inner walls 220 is less than the gap d between the outer walls 221. In an embodiment, at least two electronic components 21 are disposed on the substrate 20, the inner walls 220 are disposed between the two electronic components 21, and the encapsulant 24 is formed between a portion of the top portion 22a of the inner walls 220 and the metal layer 25.

In an embodiment, the wall portion 32b has a varying width b, r in a longitudinal section.

In an embodiment, the shielding member 22 further has at least a post portion 22c supporting the top portion 22a. In an embodiment, the wall portion 22b and the post portion 22c are alternately arranged.

In an embodiment, the side surface 24c of the encapsulant 24 is opposite to a tilting surface of the substrate.

According to the present disclosure, the design of the metal layer facilitates to reduce the width of the wall portion of the shielding member, thereby reducing the amount of the solder paste and overcoming the conventional drawback of poor solder distribution.

The above-described descriptions of the detailed embodiments are only to illustrate the implementation according to the present disclosure, and it is not to limit the scope of the present disclosure. Accordingly, all modifications and variations completed by those with ordinary skill in the art should fall within the scope of present disclosure defined by the appended claims.

What is claimed is:
1. An electronic package, comprising:
   a substrate;
   an electronic component disposed on the substrate;
   a shielding member disposed on the substrate;
   an encapsulant formed on the substrate and encapsulating the electronic component and the shielding member, with a portion of a surface of the shielding member exposed from a side surface of the encapsulant, wherein the side surface of the encapsulant is tilted relative to the substrate; and
   a metal layer formed on the encapsulant and in contact with the portion of the surface of the shielding member exposed from the side surface of the encapsulant,
   wherein the shielding member has a top portion and a wall portion bonded to the substrate and supporting the top portion, with a portion of a surface of the top portion being in contact with the metal layer,
   wherein the top portion is wider than the wall portion, and
   wherein the wall portion has a plurality of inner walls and a plurality of outer walls surrounding the inner walls, with a gap between adjacent ones of the inner walls being less than a gap between adjacent ones of the outer walls.

2. The electronic package of claim 1, wherein the encapsulant encapsulates the wall portion.

3. The electronic package of claim 1, further comprising another electronic component disposed on the substrate, wherein the inner walls are disposed between the electronic component and the another electronic component, and the encapsulant is formed between a portion of the top portion and the metal layer.

4. The electronic package of claim 1, wherein the shielding member further has a post portion supporting the top portion.

5. The electronic package of claim 4, wherein the wall portion and the post portion are alternately arranged.

6. The electronic package of claim 1, wherein the wall portion has a varying width in a longitudinal section.

7. The electronic package of claim 1, wherein the metal layer is further formed on the side surface of the encapsulant.

* * * * *